US008754381B2

(12) United States Patent
Yin et al.

(10) Patent No.: US 8,754,381 B2
(45) Date of Patent: Jun. 17, 2014

(54) METHOD FOR INSPECTING UV ILLUMINANCE IN MULTI-LEVEL BAKE FURNACE FOR TFT-LCD MANUFACTURING PROCESS AND PICKUP ASSEMBLY DEVICE FOR PERFORMING THE METHOD

(75) Inventors: Fengming Yin, Guangdong (CN); Wenpin Chiang, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 272 days.

(21) Appl. No.: 13/381,931

(22) PCT Filed: Nov. 14, 2011

(86) PCT No.: PCT/CN2011/082175
§ 371 (c)(1),
(2), (4) Date: Dec. 31, 2011

(87) PCT Pub. No.: WO2013/067715
PCT Pub. Date: May 16, 2013

(65) Prior Publication Data
US 2013/0112887 A1 May 9, 2013

(30) Foreign Application Priority Data

Nov. 9, 2011 (CN) .......................... 2011 1 0351921

(51) Int. Cl.
*H01L 21/00* (2006.01)
*G01J 1/42* (2006.01)
(52) U.S. Cl.
CPC ...................................... *H01L 21/00* (2013.01)
USPC ......... 250/372; 250/395; 414/416.03; 438/30
(58) Field of Classification Search
CPC ...................................................... H01L 21/00

USPC ................. 250/372, 395; 414/416.03; 438/30
See application file for complete search history.

(56) References Cited

U.S. PATENT DOCUMENTS

| 6,578,891 | B1 * | 6/2003 | Suzuki et al. ................. 294/185 |
| 2001/0051088 | A1 * | 12/2001 | Park et al. ................ 414/416.03 |
| 2004/0175878 | A1 * | 9/2004 | Takagi .......................... 438/200 |

FOREIGN PATENT DOCUMENTS

| CN | 100436083 C | | 11/2008 |
| CN | 101529555 A | * | 9/2009 |
| CN | 102023085 A | | 4/2011 |
| TW | 533175 B | * | 5/2003 |
| TW | 200631884 A | * | 9/2006 |

* cited by examiner

*Primary Examiner* — David Porta
*Assistant Examiner* — Abra Fein
(74) *Attorney, Agent, or Firm* — Cheng-Ju Chiang

(57) ABSTRACT

The present invention provides a method for inspecting UV illuminance in multi-level UV bake furnace for TFT-LCD manufacturing process and a pickup assembly device for performing the method. The method for inspecting UV illuminance in multi-level UV bake furnace for TFT-LCD manufacturing process includes the following steps: Step 1: providing a multi-level bake furnace for TFT-LCD manufacturing process, a pickup device, an inspection control system, and a sensor for inspecting UV illuminance; Step 2: mounting the sensor on the pickup device; Step 3: connecting the inspection control system and the sensor with communication; Step 4: operating the pickup device to bring the sensor to a site in a level of the multi-level UV bake furnace where inspection of UV illuminance is to be made; and Step 5: sensor collecting data and transmitting the data so collected to the inspection control system to thereby realize inspection. The pickup assembly device includes a pickup device and a sensor mounted to the pickup device.

6 Claims, 3 Drawing Sheets

METHOD FOR INSPECTING UV ILLUMINANCE IN MULTI-LEVEL BAKE FURNACE FOR TFT-LCD MANUFACTURING PROCESS AND PICKUP ASSEMBLY DEVICE FOR PERFORMING THE METHOD

BACKGROUND OF THE INVENTION

1. Field of the Invention

The present invention relates to a TFT-LCD (Thin Film Transistor Liquid Crystal Display) manufacturing process, and in particular to a method for inspecting UV (Ultraviolet) illuminance in multi-level bake furnace for TFT-LCD manufacturing process and a pickup assembly device for performing the method.

2. The Related Arts

For a multi-level UV bake furnace used in a TFT-LCD manufacturing process, the most important process condition is the UV illuminance to glass. Due to difference existing between individual ones of lighting tubes mounted in each level of the multi-level UV bake furnace and the difference of deterioration rate of the lifespan thereof, the UV illuminance that is irradiated to glass is varying with time and, once exceeding the requirement of the manufacturing process, will affect the quality of product. Thus, inspection of the UV illuminance for each lighting tube of each level of the furnace must be carried out according to predetermined frequency.

The conventional way of inspection is to install UV illuminance inspection sensors in each furnace level and corresponding step motors are installed to move the inspection sensors to desired inspection sites for collecting data. The sensors and the step motors are of high expenditure and require complicated wiring and a large amount of installation space and have a high chance of failure. Specifically, a conventional multi-level bake furnace used in the TFT-LCD manufacturing process has 16 levels and each manufacturing line needs 6 bake furnaces. In other words, in the conventional way of inspection, each manufacturing line needs 96 UV illuminance inspection sensors and driving motors in order to inspect if the illuminance in each level meets the requirement of the manufacturing process.

Thus, the UV illuminance inspection method adopted in the conventional multi-level UV bake furnace for TFT-LCD manufacturing process must be further improved.

SUMMARY OF THE INVENTION

An objective of the present invention is to provide a method for inspecting UV illuminance in multi-level UV bake furnace for TFT-LCD manufacturing process, which reduces the installation of facilities and the amount of space for installation and lowers the chance of failure of the facilities and thus greatly reduces the costs of facilities.

Another objective of the present invention is to provide a pickup assembly device for performing the method for inspecting UV illuminance in multi-level UV bake furnace for TFT-LCD manufacturing process, which has a simple structure, is easy to manufacture, reduces the installation of facilities, and thus reduces the cost of inspection.

To achieve the above objectives, the present invention provides a method for inspecting UV illuminance in multi-level UV bake furnace for TFT-LCD manufacturing process, which comprises the following steps:

Step 1: providing a multi-level bake furnace for TFT-LCD manufacturing process, a pickup device, an inspection control system, and a sensor for inspecting UV illuminance;

Step 2: mounting the sensor on the pickup device;

Step 3: connecting the inspection control system and the sensor with communication;

Step 4: operating the pickup device to bring the sensor to a site in a level of the multi-level UV bake furnace where inspection of UV illuminance is to be made; and Step 5: sensor collecting data and transmitting the data so collected to the inspection control system to thereby realize inspection.

The pickup device comprises a main body and a pickup fork that is mounted to the main body, and the sensor is mounted to the pickup fork.

The pickup fork comprises a plurality of support sections and a connection section connected to one end of each support sections, and the sensor is mounted to the support sections.

The sensor is mounted to an outer side of a free end of an outermost one of the support sections.

Step 4 operates the pickup device to bring the sensor to a site in a level of the multi-level UV bake furnace where inspection of UV illuminance is to be made and the site corresponds to a location where a UV lighting tube is mounted in each level of the multi-level UV bake furnace for TFT-LCD manufacturing process. The pickup device is operable to move the sensor to the site where inspection of UV illuminance is to be made in the level of the multi-level UV bake furnace by moving into the level of the multi-level UV bake furnace for TFT-LCD manufacturing process.

Step 3 connecting the inspection control system and the sensor with communication is done with wired or wireless means to establish communication connection.

The present invention also provides a pickup assembly device, which comprises a pickup device and a sensor mounted to the pickup device.

The pickup device comprises a main body and a pickup fork that is mounted to the main body, and the sensor is mounted to the pickup fork.

The pickup fork comprises a plurality of support sections and a connection section connected to one end of each support sections, and the sensor is mounted to the support sections.

The sensor is mounted to an outer side of a free end of an outermost one of the support sections.

The beneficial advantages of the present invention are as follows. The method for inspecting UV illuminance in multi-level UV bake furnace for TFT-LCD manufacturing process mounts a sensor on a pickup device to collect data of UV illuminance in furnace levels of the multi-level UV bake furnace in order to employ a driving system for an existing pickup device to move the sensor to a predetermined site to carry out inspection operation, whereby inspection can be achieved through simple structure and the devoted driving motor used in the conventional technique based inspection can be saved, making it possible not to install sensors and motors for each furnace level and thus reducing chance of failure of facilities and reducing installation and inspection costs for facilities. The present invention provides a pickup assembly device for performing the above-described method for inspecting UV illuminance in multi-level UV bake furnace for TFT-LCD manufacturing process according to the present invention, which has a simple structure and a low cost, making it advantageous for performance of inspecting UV illuminance in multi-level UV bake furnace for TFT-LCD manufacturing process.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description will be given to a preferred embodiment of the present invention and the attached drawings thereof.

Figure 1:
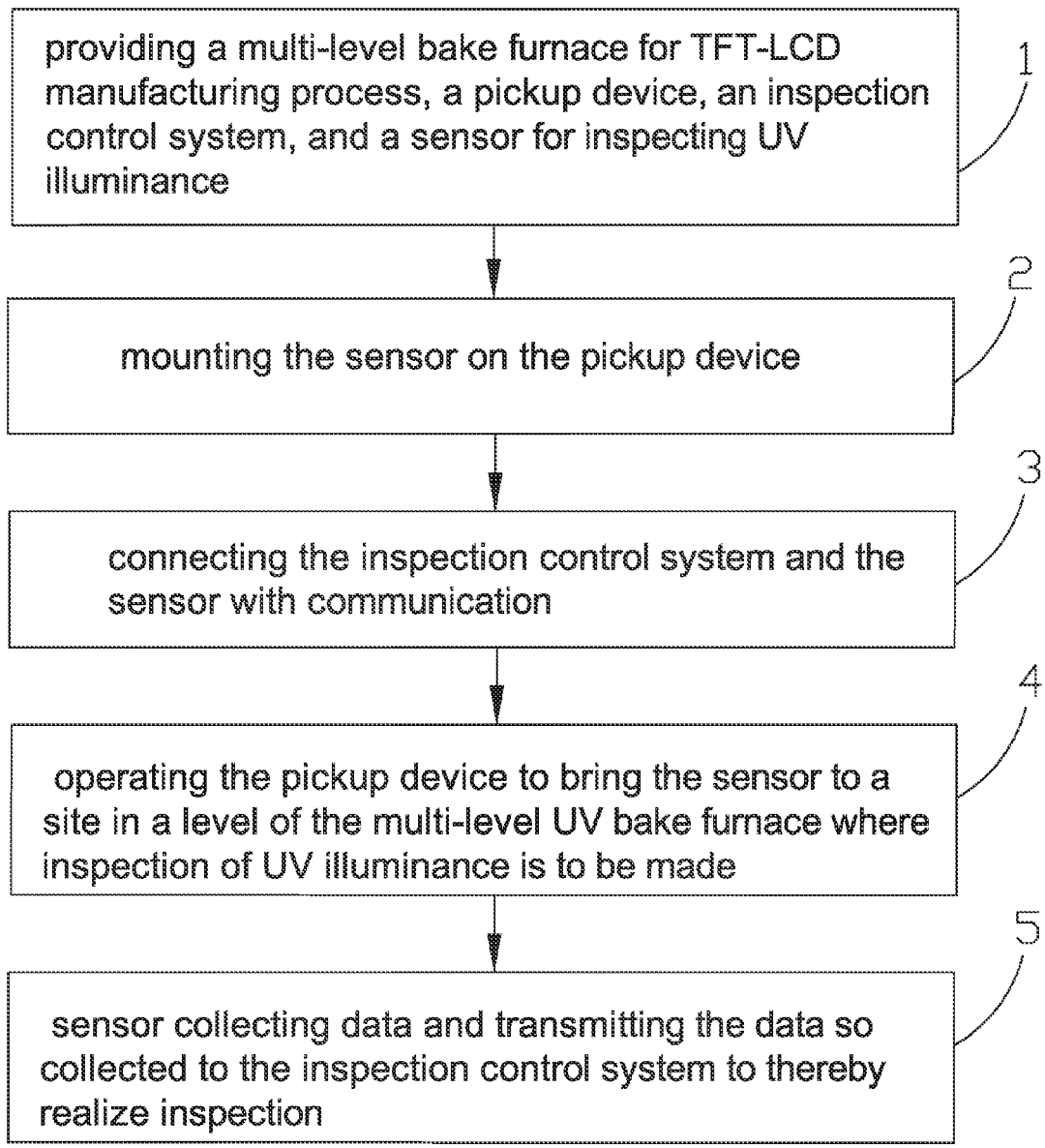
FIG. 1 is a flow chart showing a method for inspecting UV illuminance in multi-level UV bake furnace for TFT-LCD manufacturing process.

As shown in FIG. 1, a method for inspecting UV illuminance in multi-level UV bake furnace for TFT-LCD manufacturing process according of the present invention comprises the following steps:

Step 1: providing a multi-level bake furnace for TFT-LCD manufacturing process, a pickup device, an inspection control system, and a sensor for inspecting UV illuminance;

Step 2: mounting the sensor on the pickup device;

Step 3: connecting the inspection control system and the sensor with communication;

Step 4: operating the pickup device to bring the sensor to a site in a level of the multi-level UV bake furnace where inspection of UV illuminance is to be made; and Step 5: sensor collecting data and transmitting the data so collected to the inspection control system to thereby realize inspection.

Figure 2:
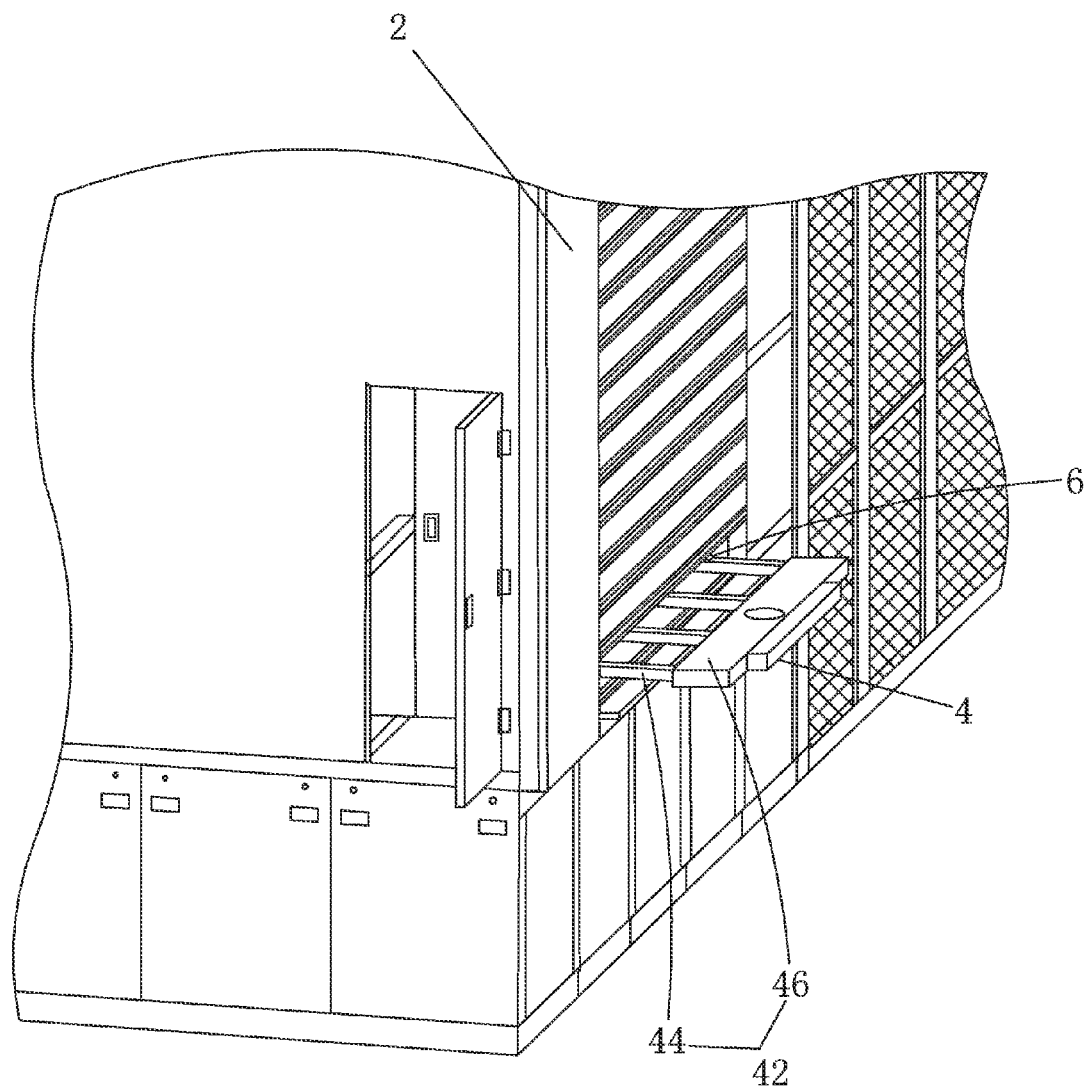
FIG. 2 is a schematic view showing facilities for performing the method for inspecting UV illuminance in multi-level UV bake furnace for TFT-LCD manufacturing process according to the present invention.
Figure 3:
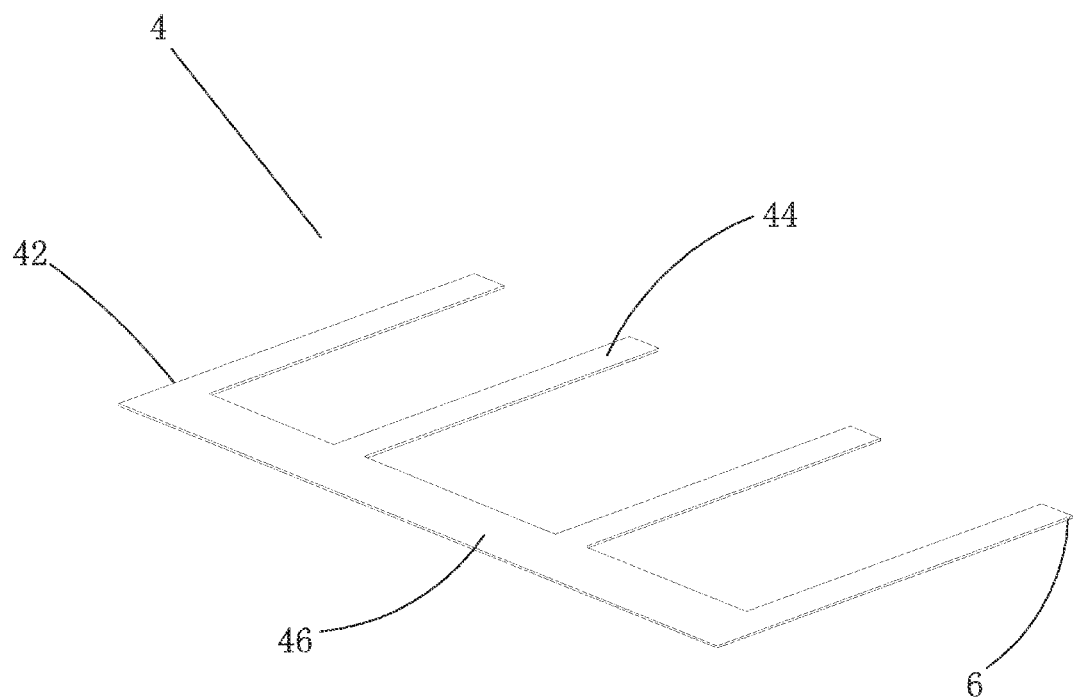
FIG. 3 is a schematic view showing a pickup assembly device for performing the method for inspecting UV illuminance in multi-level UV bake furnace for TFT-LCD manufacturing process according to the present invention.

Also referring to FIG. 2, the multi-level UV bake furnace 2, the pickup device 4, the inspection control system (not shown), and the sensor 6 for inspecting UV illuminance are all known techniques. The pickup device 4 comprises a main body (not shown) and a pickup fork 42 that is mounted to the main body. The sensor is mounted to the pickup fork 42. As shown in FIG. 3, the pickup fork 42 comprises a plurality of support sections 44 and a connection section 46 connected to one end of each support sections 44. The sensor 6 is mounted to the support sections 44, and preferably, the sensor 6 is mounted to an outer side of a free end of the outermost one of the support sections 44. As to which one of the two outermost support sections 44 is to be selected, it is determined according to the location where UV lighting tubes (not shown) are mounted in each furnace level of the multi-level UV bake furnace 2 for TFT-LCD manufacturing process and this can be done with the known techniques. Of course, it is possible to mount sensors 6 to other portions of the pickup fork 42 as desired.

Connecting the inspection control system and the sensor with communication of Step 3 can be realized through known techniques, such as wired or wireless means being both applicable. For wired means, wiring is arranged to electrically connect the sensor and the inspection control system in order to establish communication. For wireless means, then the sensor is electrically connected to a radio signal transmitter and the inspection control system is electrically connected to a radio signal receiver, so that the sensor transfers the collected data to the radio signal transmitter for transmission to the radio signal receivers, and the radio signal receiver transfers the data to the inspection control system Step 4 is to operate the pickup device to bring the sensor to a site in a level of the multi-level UV bake furnace where inspection of UV illuminance is to be made and the site corresponds to the location where UV lighting tubes are mounted in each furnace level of the multi-level UV bake furnace 2 for TFT-LCD manufacturing process. This can be done with the known techniques. The pickup device 4 moves the sensor 6 to the site where inspection of UV illuminance is to be made in the furnace level of the multi-level UV bake furnace 2 by moving into the level of the multi-level UV bake furnace 2 for TFT-LCD manufacturing process.

As shown in FIGS. 2-3, the present invention also provides a pickup assembly device for performing the above-descried method for inspecting UV illuminance in multi-level UV bake furnace for TFT-LCD manufacturing process. The pickup assembly device comprises a pickup device 4 and a sensor 6 mounted to the pickup device 4. The pickup device 4 comprises a main body (not shown) and a pickup fork 42 that is mounted to the main body. The sensor 6 is mounted to the pickup fork 42. The pickup fork 42 comprises a plurality of support sections 44 and a connection section 46 connected to one end of each support sections 44. The sensor 6 is mounted to the support sections 44, and preferably, the sensor 6 is mounted to an outer side of a free end of the outermost one of the support sections 44.

In summary, the method for inspecting UV illuminance in multi-level UV bake furnace for TFT-LCD manufacturing process mounts a sensor on a pickup device to collect data of UV illuminance in furnace levels of the multi-level UV bake furnace in order to employ a driving system for an existing pickup device to move the sensor to a predetermined site to carry out inspection operation, whereby inspection can be achieved through simple structure and the devoted driving motor used in the conventional technique based inspection can be saved, making it possible not to install sensors and motors for each furnace level and thus reducing chance of failure of facilities and reducing installation and inspection costs for facilities. The present invention provides a pickup assembly device for performing the above-described method for inspecting UV illuminance in multi-level UV bake furnace for TFT-LCD manufacturing process according to the present invention, which has a simple structure and a low cost, making it advantageous for performance of inspecting UV illuminance in multi-level UV bake furnace for TFT-LCD manufacturing process.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for inspecting UV (Ultraviolet) illuminance in multi-level UV bake furnace for TFT-LCD (Thin Film Transistor Liquid Crystal Display) manufacturing process, comprising the following steps:

Step 1: providing a multi-level bake furnace for TFT-LCD manufacturing process, a pickup device, an inspection control system, and a sensor for inspecting UV illuminance;

Step 2: mounting the sensor on the pickup device;

Step 3: connecting the inspection control system and the sensor with communication;

Step 4: operating the pickup device to bring the sensor to a site in a level of the multi-level UV bake furnace where inspection of UV illuminance is to be made; and Step 5: the sensor collecting data and transmitting the data as being collected to the inspection control system to thereby realize inspection.

2. The method for inspecting UV illuminance in multi-level UV bake furnace for TFT-LCD manufacturing process as claimed in claim 1, wherein the pickup device comprises a main body and a pickup fork that is mounted to the main body, the sensor being mounted to the pickup fork.

3. The method for inspecting UV illuminance in multi-level UV bake furnace for TFT-LCD manufacturing process as claimed in claim 2, wherein the pickup fork comprises a plurality of support sections and a connection section connected to one end of each support sections, the sensor being mounted to the support sections.

4. The method for inspecting UV illuminance in multi-level UV bake furnace for TFT-LCD manufacturing process as claimed in claim 3, wherein the sensor is mounted to an outer side of a free end of an outermost one of the support sections.

5. The method for inspecting UV illuminance in multi-level UV bake furnace for TFT-LCD manufacturing process as claimed in claim 1, wherein Step 4 operates the pickup device to bring the sensor to a site in a level of the multi-level UV bake furnace where inspection of UV illuminance is to be made and the site corresponds to a location where a UV lighting tube is mounted in each level of the multi-level UV bake furnace for TFT-LCD manufacturing process, the pickup device being operable to move the sensor to the site where inspection of UV illuminance is to be made in the level of the multi-level UV bake furnace by moving into the level of the multi-level UV bake furnace for TFT-LCD manufacturing process.

6. The method for inspecting UV illuminance in multi-level UV bake furnace for TFT-LCD manufacturing process as claimed in claim 1, wherein Step 3 connecting the inspection control system and the sensor with communication is done with wired or wireless means to establish communication connection.

* * * * *